(12) United States Patent
Ueno et al.

(10) Patent No.: US 10,317,477 B2
(45) Date of Patent: Jun. 11, 2019

(54) INSPECTION METHOD AND MANUFACTURING METHOD OF SECONDARY BATTERY

(71) Applicant: TOYOTA JIDOSHA KABUSHIKI KAISHA, Toyota-shi, Aichi-ken (JP)

(72) Inventors: Yukiyoshi Ueno, Toyota (JP); Junko Ohira, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 302 days.

(21) Appl. No.: 15/302,650

(22) PCT Filed: Mar. 19, 2015

(86) PCT No.: PCT/IB2015/000370
§ 371 (c)(1),
(2) Date: Oct. 7, 2016

(87) PCT Pub. No.: WO2015/155584
PCT Pub. Date: Oct. 15, 2015

(65) Prior Publication Data
US 2017/0030975 A1    Feb. 2, 2017

(30) Foreign Application Priority Data
Apr. 11, 2014   (JP) ................................ 2014-081851

(51) Int. Cl.
*G01R 31/385* (2019.01)
*G01R 31/392* (2019.01)
*G01R 31/36* (2019.01)
*H01M 10/0587* (2010.01)
*H01M 10/058* (2010.01)

(52) U.S. Cl.
CPC ......... *G01R 31/3865* (2019.01); *G01R 31/36* (2013.01); *G01R 31/392* (2019.01); *H01M 10/058* (2013.01); *H01M 10/0587* (2013.01)

(58) Field of Classification Search
None
See application file for complete search history.

(56) References Cited

U.S. PATENT DOCUMENTS

| 7,612,468 | B2 * | 11/2009 | Okui ....................... H02J 7/027 307/64 |
| 2010/0216000 | A1 * | 8/2010 | Fujita .................. H01M 4/0404 429/94 |
| 2011/0064973 | A1 | 3/2011 | Song |

FOREIGN PATENT DOCUMENTS

| JP | 2011-069775 A | 4/2011 |
| JP | 2012-084322 A | 4/2012 |
| JP | 2012-084346 A | 4/2012 |

(Continued)

*Primary Examiner* — John C Kuan
(74) *Attorney, Agent, or Firm* — Sughrue Mion, PLLC

(57) ABSTRACT

An inspection method of a secondary battery includes a charging step, an aging step, a pre-inspection discharge step, a voltage adjustment step, a self-discharge inspection step, and a deficiency determination step. A discharge condition in the pre-inspection discharge step is determined so that a voltage difference accumulation value Vs satisfies a predetermined range. The voltage difference accumulation value Vs is calculated by accumulating a value obtained by subtracting an output voltage from a predetermined voltage over a duration from start of the pre-inspection discharge step to end thereof.

8 Claims, 6 Drawing Sheets

(56) References Cited

FOREIGN PATENT DOCUMENTS

WO     2015/068013 A1    5/2015
WO     2015/068017 A1    5/2015

\* cited by examiner

INSPECTION METHOD AND MANUFACTURING METHOD OF SECONDARY BATTERY

BACKGROUND OF THE INVENTION

1. Field of the Invention

The present invention relates to an inspection method of a secondary battery and a manufacturing method of a secondary battery. More specifically, the present invention relates to a method for inspecting whether or not minute short-circuit occurs in a secondary battery.

2. Description of Related Art

A secondary battery such as a lithium-ion secondary battery has a lighter weight and a higher energy density in comparison with existing batteries, and is preferably used as a vehicle-mounted high-output power supply or the like. In the manufacture of such a battery, generally, an electrode body is first formed by use of a positive electrode and a negative electrode, and a battery is assembled by use of the electrode body and an electrolyte. Then, after the battery thus assembled is subjected to predetermined initial charge and aging, inspections before shipment, such as battery capacity check and self-discharge inspection, are performed thereon. The self-discharge inspection is performed such that, after the secondary battery is adjusted to a predetermined state of charge (SOC), the secondary battery is left to stand for a given period of time, and a voltage change during the leaving (self-discharge) is measured. Then, based on a measurement result obtained herein, it is determined whether or not minute internal short-circuit occurs in the secondary battery. As a technique related to this, Japanese Patent Application Publication No. 2011-069775 (JP 2011-069775 A) describes an inspection method performed in such a manner that: a secondary battery is charged to a first SOC and then left for stand (aging) for a predetermined time; subsequently, the secondary battery is discharged to a second SOC, which is lower than the first SOC; and it is determined whether or not minute short circuit occurs in the secondary battery under a temperature lower than a predetermined temperature.

SUMMARY OF THE INVENTION

According to the study of the inventors of the present invention, a voltage of the secondary battery after the aging is not stable for a while after the SOC is adjusted, so that the voltage may be kept increasing or decreasing (hereinafter, such a period is just referred to as an "unstable voltage period"). Accordingly, in order to perform self-discharge inspection (determination) with high accuracy, it is necessary to wait for the voltage of the secondary battery to be sufficiently stabilized, which generally tends to require a longer time for the inspection. Further, according to the study of the inventors, the time required for the inspection might vary depending on production lots of electrodes and conditions of the aging, for example. Accordingly, from the viewpoint of productivity, operation efficiency, and cost, it is demanded that a time required for the self-discharge inspection (e.g., an unstable voltage period) be shortened stably.

The present invention provides an inspection method that is able to determine a non-defective product in a short time by shortening a time required for self-discharge inspection without reducing accuracy of the inspection. Further, the present invention provides a method for manufacturing a highly reliable secondary battery in a short time by shortening a time required for self-discharge inspection.

The inventors examined the cause of the occurrence of the unstable voltage period, and found that a configuration of an electrode body related to the occurrence. That is, in a typical configuration of the secondary battery, from the viewpoint of improving a receiving characteristic of charge carriers in a negative electrode, a surface area (an area where an active material layer is formed) of a negative-electrode active material layer is configured to be larger than a surface area of a positive-electrode active material layer. In other words, the negative-electrode active material layer includes a part (hereinafter just referred to as a "facing portion") that is opposed to the positive-electrode active material layer, and a part (hereinafter just referred to as a "non-facing portion") that is not opposed to the positive-electrode active material layer. In the negative-electrode active material layer configured as such, when the charge carriers are stored in the facing portion by charging, a potential of the facing portion is decreased. If the battery is maintained (left for stand) at the potential, a concentration of the charge carriers is relaxed in the negative-electrode active material layer, so that the charge carriers gradually move toward an end part and a deeper part of the non-facing portion in which a potential is relatively high. When the battery is discharged after that, the charge carriers in the facing portion are released, so that the potential of the facing portion is increased. In the meantime, the charge carriers stored in the non-facing portion remains therein without being released. Because of this, the potential of the non-facing portion is relatively lower than that of the facing portion. When such unevenness (polarization) in potential occurs in the negative-electrode active material layer, the charge carriers remaining in the non-facing portion are spread to the facing portion little by little. Accordingly, variations in a cell voltage (an unstable voltage period) continue until a difference in the voltage between the facing portion and the non-facing portion is eliminated.

The inventors continuously made a diligent study from various angles so as to shorten the unstable voltage period, and accomplished the present invention. That is, an inspection method of a secondary battery, described herein, includes a charging step, an aging step, a pre-inspection discharge step, a voltage adjustment step, a self-discharge inspection step, and a deficiency determination step. Further, a discharge condition in the pre-inspection discharge step is determined so that a voltage difference accumulation value Vs satisfies a predetermined range. The voltage difference accumulation value Vs is calculated by accumulating a value obtained by subtracting an output voltage from a predetermined voltage over a duration (s) from start of the pre-inspection discharge step to end thereof. An inspection method of a secondary battery, according to a first aspect of the present invention includes: charging the secondary battery; performing an aging process, determining a discharge condition such that a voltage difference accumulation value is a value in a predetermined range, the voltage difference accumulation value being a value calculated by accumulating a value obtained by subtracting an output voltage from a predetermined voltage during a predetermined period from start of discharge to end of the discharge; performing pre-inspection discharge based on the discharge condition; performing voltage adjustment; performing self-discharge inspection; and determining whether or not internal short-circuit occurs in the secondary battery, based on a result of the self-discharge inspection.

According to the study of the inventors, it is found that there is a correlation between a maximum value (hereinafter referred to as an "increased maximum voltage") of a voltage fluctuation at the beginning of self-discharge inspection and the voltage difference accumulation value Vs in the pre-inspection discharge step. In the inspection method described herein, the voltage difference accumulation value Vs is set within the predetermined range, so that unevenness (polarization) in potential in the negative-electrode active material layer, caused before and in the aging step, can be relaxed, and the increased maximum voltage derived from a configuration of the electrode body as described above can be restrained. As a result, the unstable voltage period can be shortened, and the self-discharge inspection can be performed in a shorter time in comparison with a conventional technique. Further, it is possible to restrain measurement errors or unevenness in the self-discharge inspection to be smaller, thereby making it possible to perform the inspection with high accuracy.

In one aspect of the inspection method described herein, a range of the voltage difference accumulation value Vs is determined based on the following formula:

$$Va=-0.589881 Ln(Vs)+5.011706 \quad (I),$$

which is a relational expression between the voltage difference accumulation value Vs and the voltage maximum fluctuation ratio Va (%) at the beginning of the self-discharge inspection step. For example, when the voltage maximum fluctuation ratio Va (%) wants to be restrained to about −1.14% to 0.293%, the discharge condition of the pre-inspection discharge step should be determined so that the voltage difference accumulation value Vs satisfies 2980≤Vs≤34000. Hereby, the aforementioned unevenness (polarization) in potential in the negative-electrode active material layer can be further relaxed, thereby making it possible to precisely shorten the unstable voltage period in the self-discharge inspection. This accordingly makes it possible to realize an effect of the present invention at a high level.

In one aspect of the inspection method described herein, a voltage Vp set in the voltage adjustment step is determined based on the voltage difference accumulation value Vs. More specifically, in the voltage adjustment step, in a case where the secondary battery is charged to the setting voltage Vp by constant-current charge, and then charged at the setting voltage Vp by constant-voltage charge, the setting voltage Vp should be determined based on the following formula:

$$Vp=I \times R+Vb \quad (II),$$

where I indicates a cutoff current (A) of the constant-voltage discharge, R indicates an apparent resistance value (Ω) calculated based on the voltage difference accumulation value Vs, and Vb indicates a start voltage (V) of the self-discharge inspection step. When the setting voltage Vp is determined based on the voltage difference accumulation value Vs, the unevenness (polarization) in potential in the negative-electrode active material layer can be further relaxed appropriately. This makes it possible to achieve a generally constant voltage in the self-discharge inspection step. For example, a gap between a start voltage and an inspection voltage in the self-discharge inspection step can be restrained to be small. As a result, it is possible to largely eliminate (or reduce) a stand-by time necessary to stabilize the voltage, thereby making it possible to largely shorten a time necessary for the self-discharge inspection in comparison with a conventional technique. Further, since the voltage is stabilized at the time of the inspection, it is possible to perform non-defective determination with high accuracy.

In one aspect of the inspection method described herein, in the pre-inspection discharge step, constant-voltage discharge is performed after constant-current discharge. According to the study of the inventors, the voltage difference accumulation value Vs can be obtained in a short time due to the constant-voltage discharge. Hereby, by performing the constant-voltage discharge, it is possible to further shorten a time necessary for the self-discharge inspection.

In one aspect of the inspection method described herein, in the pre-inspection discharge step, a discharge final voltage is set to between 1.8 V and 2.3 V inclusive. When the discharge final voltage (an achievable voltage) is set within the above range, a potential difference between a facing portion and a non-facing portion can be made large, thereby yielding such an effect that charge carriers remaining in the non-facing portion are easy to come out from the non-facing portion. Hereby, the unevenness in potential in the negative-electrode active material layer can be relaxed appropriately, thereby making it possible to further shorten the unstable voltage period. Further, since the voltage at the time of the inspection can be stabilized, it is possible to detect a defective product (a battery in which internal short-circuit occurs) with higher accuracy.

As another aspect of the present invention, a manufacturing method of a secondary battery is provided. The manufacturing method includes the following steps: preparing an electrode body including a positive electrode having a positive-electrode active material layer and a negative electrode having a negative-electrode active material layer, a surface area of the negative-electrode active material layer being larger than a surface area of the positive-electrode active material layer, and the negative-electrode active material layer including a part opposed to the positive-electrode active material layer, and a part not opposed to the positive-electrode active material layer; assembling a battery assembly by use of the electrode body and an electrolyte; inspecting whether or not internal short-circuit occurs in the above inspection method, so as to select a non-defective product. A method for manufacturing a secondary battery, according to a second aspect of the present invention, includes: preparing an electrode body including a positive electrode having a positive-electrode active material layer and a negative electrode having a negative-electrode active material layer, a surface area of the negative-electrode active material layer being larger than a surface area of the positive-electrode active material layer, and the negative-electrode active material layer including a part faced to the positive-electrode active material layer, and a part not faced to the positive-electrode active material layer; assembling a battery assembly by use of the electrode body and an electrolyte; and inspecting whether or not internal short-circuit occurs in the secondary battery by the inspection method according to the first aspect, so as to select a non-defective product. As described above, according the inspection method described herein, it is possible to perform non-defective determination with high accuracy in a shorter time in comparison with a conventional technique. Accordingly, it is possible to manufacture a highly reliable battery in a shorter time in comparison with a conventional technique. Note that, in the present specification, a "battery assembly" generally indicates an assembly assembled by use of the electrode body manufactured as above and the electrolyte to a stage prior to the inspection step, and a type and a configuration of the battery are not limited in particular. For example, a battery outer case may not be sealed yet, or may be sealed.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The following describes a preferred embodiment of the present invention with reference to the drawings appropriately. Note that a matter that is not particularly mentioned in the present specification but is necessary for execution of the present invention can be understood as a design matter of a person skilled in the art based on conventional techniques in the art. The present invention can be performed based on what is described in the present specification and a common general technical knowledge in the art.

Figure 1:
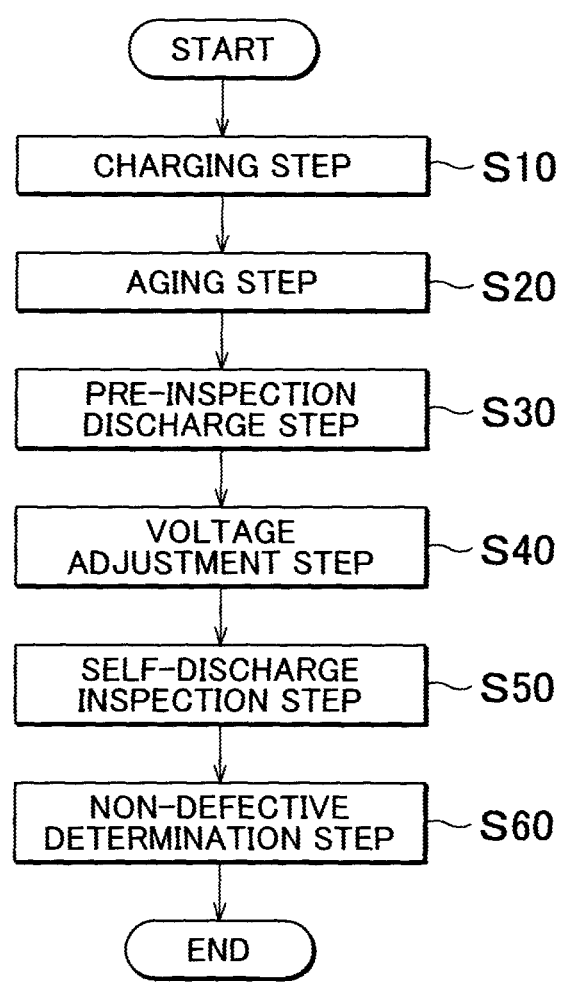
FIG. 1 is a flowchart of an inspection method according to one embodiment.
Figure 2:
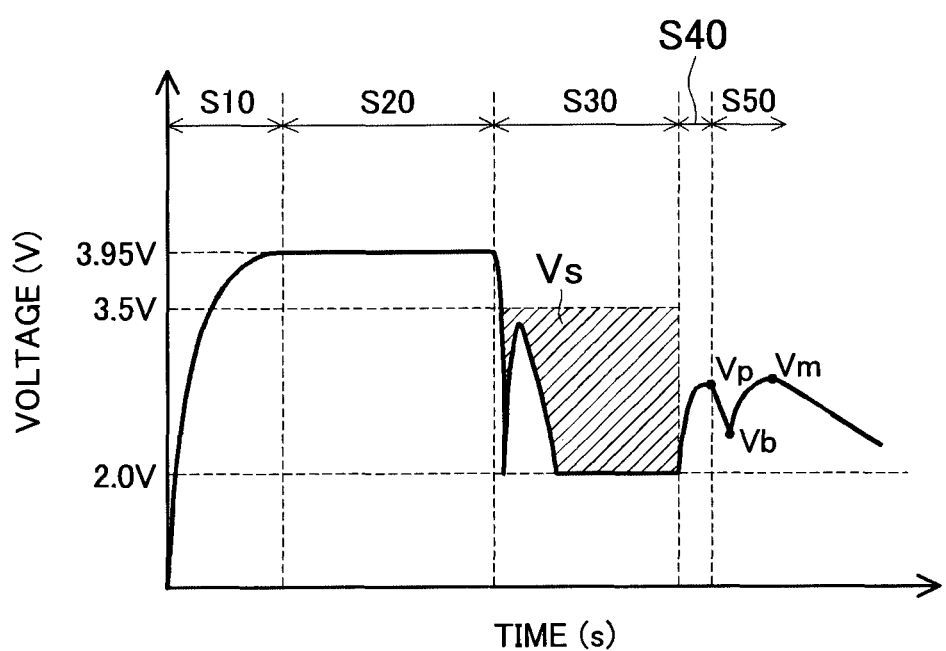
FIG. 2 is a graph showing a voltage change of a secondary battery according to one embodiment.

«Inspection Method of Secondary Battery» An inspection method described herein is to check whether or not internal short-circuit occurs in an assembled secondary battery. As illustrated in a flowchart of FIG. 1, the inspection method roughly includes the following six steps: a charging step (S10); an aging step (S20); a pre-inspection discharge step (S30); a voltage adjustment step (S40); a self-discharge inspection step (S50); and a non-defective determination step (S60). Further, FIG. 2 shows a voltage change of a secondary battery according to one embodiment. The following describes each of the steps sequentially with reference to the drawings.

(S10) Charging Step

In the charging step, the secondary battery is charged at least once (initial charge) typically in an ordinary temperature range (e.g., 20° C. to 25° C.). In general, an external power supply is connected between a positive electrode (a positive terminal) and a negative electrode (a negative terminal) of the battery, and the battery is charged to a predetermined voltage (typically, constant-current charge is performed). An achievable voltage (typically, a maximum achievable voltage) between the positive and negative terminals in the initial charge depends on types of active materials and a nonaqueous solvent, and so on. In view of this, the achievable voltage is not limited in particular, but is preferably in a voltage range that can be exhibited at the time when an SOC of the secondary battery is 65% to 110% (typically, 80% to 110%, e.g., 80% to 105%). For example, in a case of a battery that is fully charged at 4.2 V, a voltage between positive and negative electrodes should be set in a range of approximately 3.8 V to 4.3 V. In an aspect shown in FIG. 2, a cell voltage (a final voltage) after the charging step (after the charging) is set to approximately 3.95 V.

A charging method is not limited in particular. For example, the secondary battery may be charged at a constant current until its voltage reaches the above voltage (CC charge), or may be subjected to CC charge until its voltage reaches the above voltage, and then charged at a constant voltage (CCCV charge). A charging rate in the charging is not limited in particular, but if the charging rate is too low, process efficiency (operation efficiency) tends to decrease. Meanwhile, if the charging rate is too high, a potential of the positive electrode is locally increased too much, so that a positive-electrode active material may deteriorate. In view of this, the charging rate is preferably approximately 0.1 C to 5 C (e.g., 0.5 C to 2 C). Note that the charging may be performed once, or may be performed repeatedly twice or more times with discharging being performed every time after the charging is performed, for example. Further, in a range in which battery characteristics are not adversely affected, other operations (e.g., application of a load of a pressure or application of ultrasonic wave) can be also performed as appropriate.

(S20) Aging Step

In the aging step, the battery just subjected to the initial charge (typically, the SOC is 65% or more, e.g., the SOC is 80% or more) is adjusted to have a predetermined temperature, and the battery is maintained (left for stand) in the temperature range for a predetermined period. As a preferred aspect, a voltage between the terminals adjusted in the charging step or a voltage generally equivalent thereto (e.g., around ±0.5 V) is maintained over the whole aging step. For example, in a case of the battery that is fully charged at 4.2 V, it is preferable to maintain a state where the voltage between the positive and negative electrodes is approximately 3.7 V to 4.3 V (in the aspect shown in FIG. 2, approximately 3.95 V) over the whole aging step. For this purpose, a voltage maintaining technique such as constant-voltage charge (CV charge) can be employed.

The temperature in which the secondary battery is maintained should be set to a relatively high temperature of 35° C. or more (typically, 40° C. or more, e.g., 60° C. or more). In a case where foreign metal or the like is included in the secondary battery, for example, when the secondary battery is maintained under a high temperature environment, a difference is easy to appear markedly in the self-discharge inspection step performed later. This makes it possible to perform the inspection with high accuracy. From the viewpoint of preventing high temperature deterioration or in consideration of a production cost, an upper limit of the temperature should be 80° C. or less (typically, 75° C. or less, preferably 70° C. or less, more preferably, 65° C. or less), for example. As a method for increasing and maintaining the temperature of the battery, heating means such as a temperature-control constant-temperature bath or an infrared heater can be used, for example.

Further, a period (time) to maintain the secondary battery depends on a setting temperature or the like, for example, so is not limited in particular. However, typically, a total time from start of temperature increase should be 5 hours or more (e.g., from 5 hours to 48 hours, preferably from 10 hours to 24 hours). When the time is 5 hours or more, it is possible to restrain measurement errors and unevenness in the self-discharge inspection to be smaller, thereby making it possible to perform the inspection with high accuracy. Further, by restraining the maintaining period to a minimum, it is possible to restrain the charge carriers from moving too much to a non-facing portion of a negative-electrode active material layer. Accordingly, an unstable voltage period in the self-discharge inspection step can be shortened further, thereby making it possible to efficiently perform the inspection. In the aspect shown in FIG. 2, the maintaining temperature is set to 60° C. and the maintaining time is set to 20 hours.

In a case where the aging step is performed under a high temperature environment, the secondary battery should be cooled down immediately after the aging, so that the temperature of the secondary battery is decreased to a temperature region of around 35° C. to 55° C., for example. This makes it possible to reduce a stand-by time necessary to stabilize a battery temperature and to increase production efficiency more.

(S30) Pre-inspection Discharge Step

In the pre-inspection discharge, the secondary battery is discharged at least once. In general, the external power supply is connected between the positive electrode (the positive terminal) and the negative electrode (the negative terminal) of the battery, and the battery is discharged to a predetermined voltage (typically, constant-current discharge). In the inspection method described herein, a discharge condition in the pre-inspection discharge step is determined so that a voltage difference accumulation value Vs is within a predetermined range. The voltage difference accumulation value Vs is calculated by accumulating a value obtained by subtracting an output voltage from a predetermined voltage over a duration (s) from start of the pre-inspection discharge step to end thereof.

Figure 3:
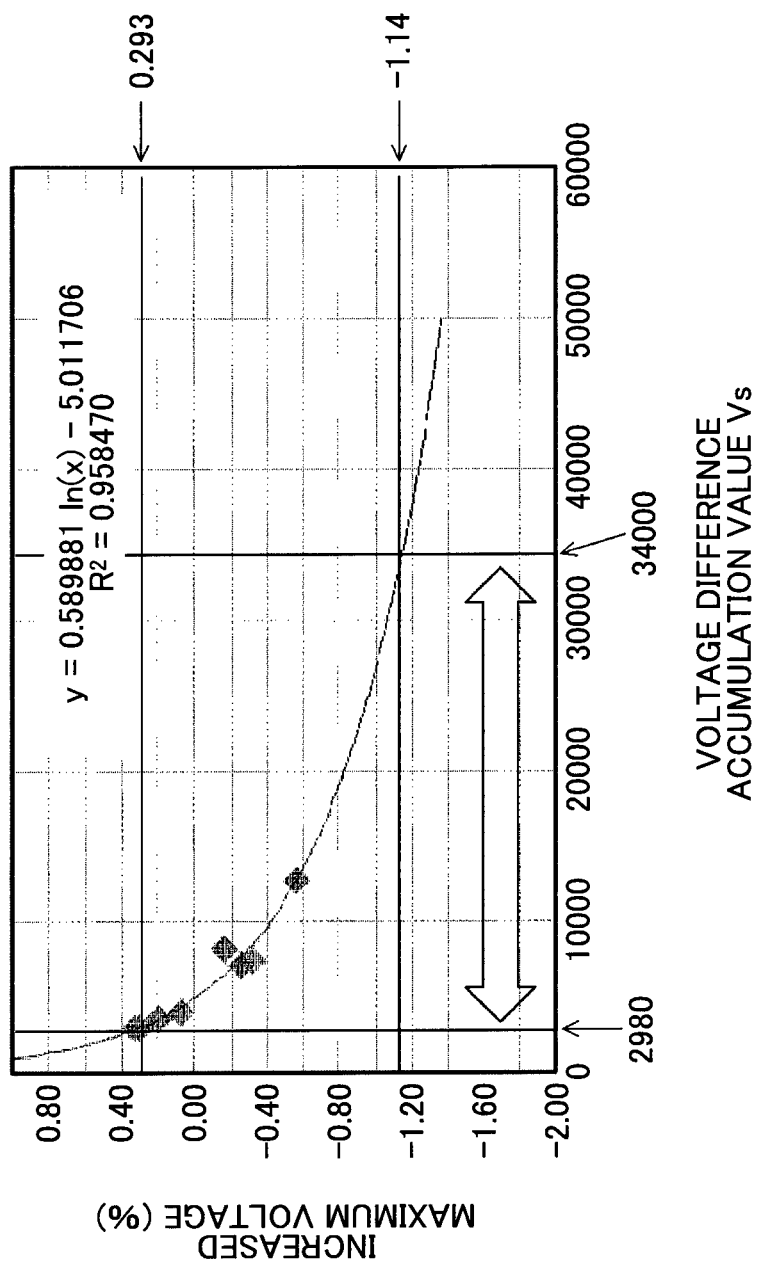
FIG. 3 is a graph showing a relationship between a voltage difference accumulation value Vs and a voltage maximum fluctuation ratio Va in a self-discharge inspection step.

This will be described more specifically with reference to FIGS. 2 and 3. FIG. 3 shows a result obtained by the inventors examining a relationship between a voltage difference accumulation value Vs (V·s) in the pre-inspection discharge step and a voltage maximum fluctuation ratio Va (%) at the beginning of the self-discharge inspection step. The examination was performed on a lithium-ion secondary battery (battery capacity: 28 Ah) assembled by the inventors so as to be fully charged at 4.2 V. Note that the voltage difference accumulation value Vs is calculated by accumulating a value obtained by subtracting an output voltage from a predetermined voltage (here 3.5 V) in a shaded part in FIG. 2, i.e., over a whole duration (s) from the start of the pre-inspection discharge step to the end thereof. Further, an increased maximum voltage (%) corresponding to a vertical axis in FIG. 3, that is, the voltage maximum fluctuation ratio Va is a maximum fluctuation ratio of a voltage when a fluctuation ratio is "0" at 3.29 V, and shown in terms of a percentage (%). As is apparent from FIG. 3, according to the study of the inventors, it is found that there is a correlation between the voltage difference accumulation value Vs and the voltage maximum fluctuation ratio Va (%) at the beginning of the self-discharge inspection step. Accordingly, it is found that, when the voltage difference accumulation value Vs is set in a predetermined range, a variation (typically, an increase) of the voltage at the beginning of the self-discharge inspection step can be restrained to be smaller.

As a preferred aspect, a range of the voltage difference accumulation value Vs is determined based on the following relational expression between the voltage difference accumulation value Vs and the voltage maximum fluctuation ratio Va (%) at the beginning of the self-discharge inspection step:

$$Va = -0.589881 Ln(Vs) 5.011706 \quad (I).$$

According to the study of the inventors, the discharge condition in the pre-inspection discharge step is determined so that the voltage difference accumulation value Vs is within a predetermined range, from Formula (I), and further, a setting voltage Vp in the voltage adjustment step is determined from the after-mentioned Formula (II). Hereby, a gap between a start voltage Vb and an inspection voltage Vm in the self-discharge inspection as shown in FIG. 2 can be restrained to be small, thereby making it possible to largely shorten an unstable voltage period. More specifically, when the increased maximum voltage is 3.29 V, for example, the voltage difference accumulation value Vs is 4894, which is obtained from Formula (I), and the discharge condition in the pre-inspection step is determined so as to satisfy this. Based on findings of the inventors, when the increased maximum voltage should be restrained within a range from 3.25 V to 3.3 V (that is, the voltage maximum fluctuation ratio Va (%) is from −1.14% to 0.293%), the voltage difference accumulation value Vs should be adjusted to satisfy 2980≤Vs≤34000. When Vs is set to 2980 or more (preferably, 7500 or more, more preferably, 9000 or more), the increased maximum voltage can be restrained to 0.8 V or less (preferably, 0.6 V or less, more preferably 0.2 V or less) relative to a target inspection voltage Vm. Further, when Vs is set to 34000 or less (for example, 10000 or less), the increased maximum voltage can be restrained to −0.6 V or less (e.g., −0.4 V or less) relative to the target inspection voltage Vm. Note that the voltage difference accumulation value Vs can be adjusted by an achievable voltage (a final voltage) in the discharge, a discharge method, a discharge current value, a discharge time, the number of times of the discharge, and the like.

For example, in a case of the battery that is fully charged at 4.2 V, the achievable voltage (final voltage) between the positive and negative terminals should be set in a range of approximately 1.8 V to 2.3 V (typically, 1.8 V to 2.2 V, e.g., 1.9 V to 2.1 V). In the aspect shown in FIG. 2, a cell voltage (a final voltage) after the pre-inspection charging step is set to approximately 2.0 V. When the final voltage is set to the above range, it is possible to improve accuracy of the inspection and to further shorten the self-discharge inspection step. That is, when the final voltage is set to 1.8 V or more (e.g., 1.9 V or more), it is possible to restrain a potential of the negative electrode from locally increasing too much, thereby making it possible to prevent a negative-electrode active material from deteriorating and to prevent an electrolyte from being decomposed by reduction. Further, when the final voltage is set to be low, e.g., 2.3 V or less (preferably, 2.2 V or less, more preferably, 2.1 V or less), a potential difference between a facing portion and the non-facing portion in the negative-electrode active material layer can be made large. Accordingly, the charge carriers remaining in the non-facing portion is easy to come out therefrom, so that unevenness in potential in the negative-electrode active material layer can be preferably relaxed. As a result, an unstable voltage period in the self-discharge inspection step can be shortened. Note that, according to the study of the inventors, if the final voltage is set to 2.5 V or more, the voltage after the pre-inspection discharge may be increased sharply, which is unfavorable.

A discharge method is not limited in particular, and should be determined in consideration of the voltage difference accumulation value Vs, and so on. For example, the secondary battery may be discharged at a constant current until its voltage reaches a predetermined voltage (CC discharge), or may be discharged at a constant current until its voltage reaches a predetermined voltage, and then discharged at a constant voltage (CCCV discharge). According to the study of the inventors, from the viewpoint of obtaining the voltage difference accumulation value Vs in a short time, the CCCV discharge is preferable. Hereby, the voltage difference accumulation value Vs can be adjusted to a predetermined range in a short time, thereby making it possible to further shorten a time necessary for the self-discharge inspection.

A discharge rate in the discharge is not limited in particular, but if the discharge rate is too low, process efficiency (operation efficiency) tends to decrease. Meanwhile, if the discharge rate is too high, the electrolyte may be locally decomposed electrochemically. In view of this, the discharge rate is preferably set to about 0.01 C to 5 C (e.g., 0.05 C to 3 C). For example, in a case of a battery having a theory capacity of approximately 20 Ah to 30 Ah, a current value should be set to approximately 0.5 A to 75 A. Further, the discharge may be performed once, or may be performed repeatedly twice or more times at a given interval. In this case, the discharge rate may be the same or may be different for each time. As a preferred aspect, the constant-current discharge (multistage discharge) is performed several times in such a manner that the discharge rate of the first discharge is largest, and the discharge rate is decreased at the second discharge and then further decreased at the third discharge. In such an aspect, the voltage of the battery can be stabilized in a shorter time. Further, a time interval at the time when the discharge is performed several times varies depending on the discharge rate, but can be about several tens of seconds to several tens of minutes (typically several minutes), for example. For example, in the aspect shown in FIG. 2, five minutes after constant-current discharge (capacity check) is performed at 60 A (2.1 C) until the voltage reaches 2.0 V, the constant-current discharge is further performed at 20 A (0.71 C) until the voltage reaches to 2.0 V, and then, constant-voltage discharge is performed at 2.0 V until a current reaches 0.5 A (under a condition of cutoff of 0.5 A).

In another preferred aspect, in the pre-inspection discharge step, the temperature of the battery is maintained to not less than 20° C. but not more than 55° C. Note that, if the temperature is within the temperature range, the temperature may be constant over the pre-inspection discharge step, or may not be constant over the pre-inspection discharge step. When the battery is discharged while being maintained in the temperature range of 20° C. or more, the charge carriers can smoothly move within the negative-electrode active material layer. As a result, the unevenness in potential in the negative-electrode active material layer can be relaxed appropriately, thereby making it possible to further shorten the unstable voltage period. Further, when the temperature of the battery is set to 55° C. or less, it is possible to restrain deterioration at a high temperature. Further, it is possible to eliminate (or reduce) a stand-by time necessary to stabilize the temperature of the battery in a subsequent step.

(S40) Voltage Adjustment Step

In the voltage adjustment step, typically, in an ordinary temperature area (e.g., 20° C. to 25° C.), the battery subjected to the pre-inspection discharge is adjusted to a predetermined setting voltage Vp. Generally, for a battery provided in a vehicle such as a plug-in hybrid vehicle (PHV), a high power density and durability could be requested in a wide SOC region. However, generally, a power density of the secondary battery tends to decrease, as its SOC is decreased more (the battery capacity is decreased more). Accordingly, in an in-vehicle battery (particularly for the PHV), performance in a low SOC region (a region where the SOC is 30% or less, for example) is easy to become a problem. As such, in a case where the secondary battery to which a high output in the low SOC region (a region where the SOC is 30% or less) is required is a subject of the inspection, the SOC should be adjusted to 20% or less (preferably, 10% or less, e.g., 1% to 5%). Hereby, battery performance in the low SOC region can be evaluated precisely. Further, according to the study of the inventors, by adjusting the battery to a low SOC state, sensitivity of the self-discharge inspection can be improved in comparison with a conventional technique.

As a preferred aspect, the setting voltage Vp is determined based on the voltage difference accumulation value Vs. Hereby, an amount of the charge carriers remaining in the non-facing portion can be reduced, so that an increased amount of a voltage in the self-discharge inspection step can be restrained to be small. For example, according to the aspect shown in FIG. 2, the self-discharge inspection step can be shortened by around 2 to 3.5 days as compared with a conventional technique.

A charge or discharge pattern at the time of the voltage adjustment is not limited in particular. For example, the secondary battery may be charged or discharged at a constant current until its voltage reaches the setting voltage Vp (CC charge or CC discharge), or the secondary battery may be charged or discharged at a constant current until its voltage reaches the setting voltage Vp, and then charged or discharged at a constant voltage (CCCV charge or CCCV discharge). From the viewpoint of adjusting the voltage more precisely, the CCCV charge or the CCCV discharge is preferable.

Figure 4:
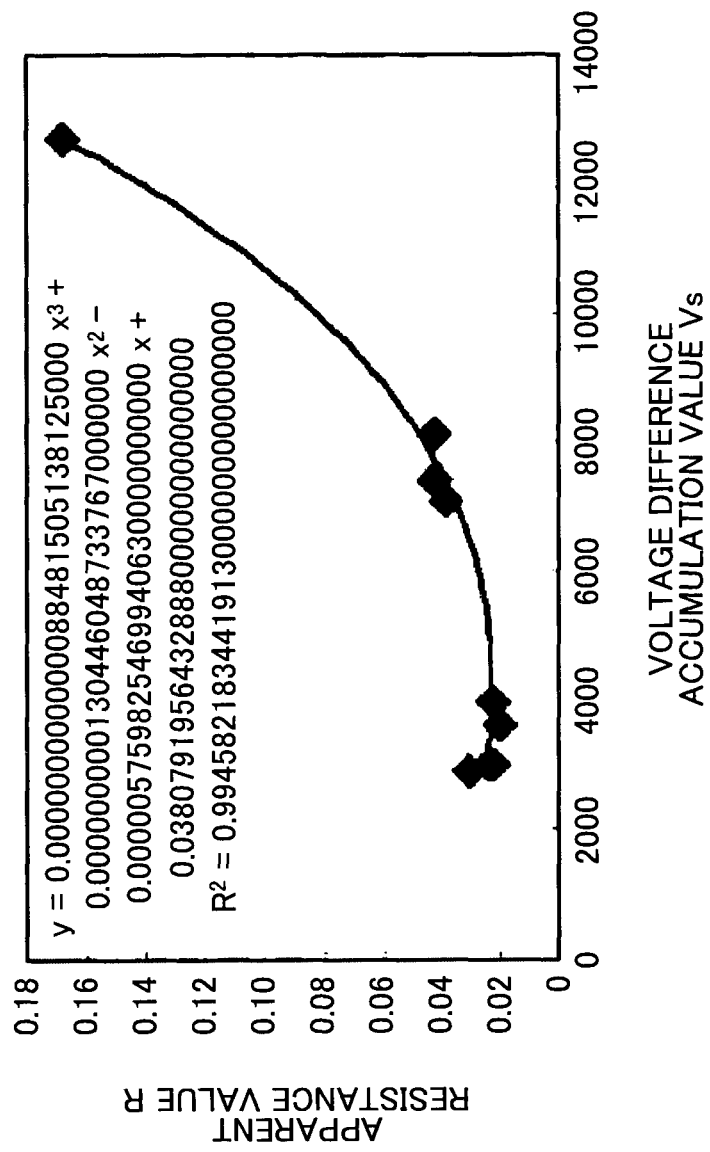
FIG. 4 is a graph showing a relationship between a voltage difference accumulation value Vs and an apparent resistance value R.

For example, in a case where the voltage is adjusted by the CCCV discharge, the setting voltage Vp should be determined based on the following formula:

$$Vp = I \times R + Vb \quad (II),$$

where I is a cutoff current (A) of the constant-voltage discharge, R is an apparent resistance value (Ω) calculated based on the voltage difference accumulation value Vs, and Vb is a start voltage (V) of the self-discharge inspection step. That is, first, (1) the voltage difference accumulation value Vs is determined so that the increased maximum voltage becomes a target inspection voltage Vm. Then, (2) from the voltage difference accumulation value Vs, the "apparent resistance value R" is obtained based on the ohm's law. This will be described more specifically with reference to FIG. 4. FIG. 4 shows a result obtained by the inventors examining a relationship between the voltage difference accumulation value Vs (V·s) in the pre-inspection discharge step and the apparent resistance value R (Ω) at the beginning of the self-discharge inspection step. The examination was performed on a lithium-ion secondary battery (battery capacity: 28 Ah) assembled by the inventors so as to be fully charged at 4.2 V. Here, the apparent resistance value R can be calculated such that the start voltage Vb in the self-discharge inspection step is subtracted from the setting voltage Vp of the voltage adjustment step, and a resultant value is divided by a cutoff current I (A) in the constant-voltage discharge (that is, R=(Vp−Vb)/I)). As illustrated in FIG. 4, from the voltage difference accumulation value Vs and the apparent resistance value R, an approximate expression of a coefficient of determination $R^2$=0.99 or more is obtained. When a value of the voltage difference accumulation value Vs determined as above is substituted for the expression, the apparent resistance value R can be calculated. Then, (3) the start voltage Vb of the self-discharge inspection step is set. Here, Vb should be determined based on empirical rules of the inventors so that a difference between Vb and the increased maximum voltage is 5 mV or less. Unevenness in voltage is increased due to diffusion of the charge carriers from the non-facing portion. Accordingly, by restraining a diffusing amount of the charge carriers to the non-facing portion, the unevenness in voltage can be made smaller. Subsequently, (4) by use of the apparent resistance value R and the start voltage Vb, the setting voltage Vp is calculated from Formula (II). For example, in a case where the cutoff current I of the constant-voltage discharge is 0.5 A, the setting voltage Vp should be calculated from the following formula:

$$Vp=0.5\times R+Vb \quad (III).$$

Then, the voltage of the battery should be adjusted to reach the setting voltage Vp thus obtained.

(S50) Self-discharge Inspection Step

Herein, it is preferable to stabilize a state in the battery, first. That is, after the voltage adjustment step is finished, the voltage of the battery is decreased to the start voltage Vb due to the apparent resistance value R, as shown in FIG. 2. Then, the voltage is kept increased little by little until the voltage reaches the increased maximum voltage. Accordingly, in order to perform the self-discharge inspection with high accuracy, it is necessary to wait for the voltage of the battery to be stabilized. In the inspection method described herein, a voltage increased amount at the beginning of the self-discharge inspection can be restrained, thereby making it possible to shorten a time necessary for voltage stabilization. Further, in a case where the temperature is increased in the aging step, for example, it is preferable to stabilize the battery temperature in the ordinary temperature area (e.g., 20° C. to 25° C.). This makes it possible to perform the inspection with high accuracy. Then, the battery in a stable state should be left for stand (self-discharged) for a given period, so as to measure a voltage drop amount from the inspection start voltage. According to the inspection method described herein, it is possible to lower the influence of the unevenness in the voltage increase, thereby making it possible to accurately evaluate and find whether or not internal short-circuit occurs.

(S60) Non-defective Determination Step

Here, based on the result (the voltage drop amount) obtained in the self-discharge inspection step, it is determined whether or not the battery is good (whether or not internal short-circuit occurs). More specifically, first, based on the mensuration result of the voltage drop amount, a reference value for non-defective determination is set. A setting method of the reference value is not limited in particular, but an arithmetical mean value, a median, or the like of voltage drop amounts of a plurality of batteries can be employed, for example. Then, a difference between the reference value and the voltage drop amount of each of the batteries is calculated. When the difference is a predetermined threshold or less, it is determined that "no internal short-circuit occurs" in the battery. When the difference is more than the predetermined threshold, it is determined that "internal short-circuit occurs" in the battery. The threshold depends on a specification or the like of the battery as a target, and therefore is not limited in particular. However, the threshold can be set to a value corresponding to about 2 σ to 4 σ (σ indicates a standard deviation). Then, the battery that is evaluated that "internal short-circuit occurs" based on the determination result is removed. This can prevent defective products from flowing into its subsequent step, so that highly reliable batteries can be provided.

«Manufacturing method of Secondary Battery» The manufacturing method described herein is characterized by including the above internal short-circuit inspection method of the secondary battery. More specifically, the manufacturing method includes the following steps: an electrode-body preparation step (S1); a battery-assembly assembling step (S2); and an inspection step (S3). As described above, according to the inspection method described herein, even in a case of a secondary battery including a negative electrode having a non-facing portion in a negative-electrode active material layer, for example, it is possible to accurately inspect whether or not internal short-circuit occurs in a short time, and to remove a defective product. Accordingly, it is possible to manufacture a highly reliable secondary battery in a short time in comparison with a conventional technique. Note that the inspection step (S3) of the battery is the same as the above steps (S10) to (S60), so detailed descriptions thereof are omitted herein.

(S1) Electrode-body Preparation Step

Here, an electrode body including a positive electrode having a positive-electrode active material layer and a negative electrode having a negative-electrode active material layer is prepared. The electrode body is manufactured such that the positive electrode and the negative electrode are opposed to each other typically via a separator, and laminated.

The positive electrode typically includes a positive current collector, and a positive-electrode active material layer formed on the positive current collector. As the positive current collector, a conductive member made of metal (e.g., aluminum) having a good electrical conductivity is preferably used. The positive-electrode active material layer includes at least a positive-electrode active material, and can also include other optional components as needed. Preferable examples of the positive-electrode active material include layered and spinel lithium composite metal oxides (e.g., $LiNiO_2$, $LiCoO_2$, $LiMn_2O_4$, $LiNi_{0.33}Co_{0.33}Mn_{0.33}O_2$, $LiNi_{0.38}CO_{0.32}Mn_{0.30}O_2$, $LiNi_{0.5}Mn_{1.5}O_4$) and olivine materials (e.g., $LiFePO_4$). Especially, from the viewpoint of thermostability and energy density, a lithium nickel cobalt manganese composite metal oxide having a layered structure and containing Li, Ni, Co, and Mn as constituent elements is preferable. The optional components that can be included in the positive-electrode active material layer include a binder and a conductive material. As the binder, polyvinylidene fluoride (PVdF), polyethylene oxide (PEO), and the like can be preferably used, for example. Further, as the conductive material, carbon materials such as various types of carbon black (e.g., acetylene black and Ketjen black), active carbon, graphite, and carbon fiber can be preferably used, for example.

The negative electrode typically includes a negative current collector, and a negative-electrode active material layer formed on the negative current collector. As the negative current collector, a conductive member made of metal (e.g., copper) having a good electrical conductivity is preferably used. The negative-electrode active material layer includes at least a negative-electrode active material, and can also include other optional components as needed. Preferable examples of the negative-electrode active material include graphite, hardly graphitized carbon (hard carbon), easily graphitized carbon (soft carbon), carbon nano-tube, and the like carbon materials. Especially, amorphous coated graphite (configured such that surfaces of graphite particles are coated with amorphous carbon) is preferable. A preferable example of the amorphous coated graphite is such that a BET specific surface area is 5 $m^2/g$ or less (e.g., 2 $m^2/g$ to 5 $m^2/g$). Further, another preferable example is such that a coverage (an amount of coating) of amorphous carbon is less than 5% (typically, 3% or less, e.g., 0.5% to 3%). In such a configuration, it is possible to realize battery characteristics (e.g., input-output characteristics) excellent in a low SOC region (e.g., a region where the SOC is 30% or less), for example. The optional components that can be included in the negative-electrode active material layer include a binder and a thickener. Styrene butadiene rubber (SBR), polyvinylidene fluoride (PVdF), polytetrafluoroethylene (PTFE), or the like can be preferably used as the binder, for example. Cellulose such as carboxymethyl cellulose (CMC) or methyl cellulose (MC) can be preferably used as the thickener.

In the invention described herein, a surface area of the negative-electrode active material layer is larger than a surface area of the positive-electrode active material layer. In other words, the negative-electrode active material layer includes a part (a facing portion) opposed to the positive-electrode active material layer, and a part (a non-facing portion) that is not opposed to the positive-electrode active material layer. As described above, in a case where the electrode body configured as described above is included, a period required for the self-discharge inspection (typically, an unstable voltage period after the SOC is adjusted) tends to be long in general. In view of this, an application of the present invention is effective.

An initial capacity ratio of the positive and negative electrodes, that is, a capacity ratio ($C_N/C_P$) calculated as a ratio of an initial charge capacity ($C_N$) of the negative electrode to an initial charge capacity ($C_P$) of the positive electrode should be 1.0 to 2.1 (typically, 1.0 to 1.5), for example, although the initial capacity ration is not limited to this. This can realize a high energy density and an excellent cycle characteristic.

As the separator, a porous sheet, a nonwoven fabric, and the like similar to those used in a general secondary battery can be used. Preferable examples of the separator include porous resin sheets made of resins such as polyethylene (PE), polypropylene (PP), and polyester. Further, the separator may be formed as a heat-resistant separator including an organic porous layer made of the porous sheet, the nonwoven fabric, or the like, and a porous heat resistance layer held on one side or both sides (typically, one side) of the organic porous layer. Such a porous heat resistance layer can be a layer containing an inorganic material (e.g., inorganic filler such as alumina particles) and a binder. Alternatively, the porous heat resistance layer can be a layer containing resin particles having an insulating property (e.g., particles of polyethylene, polypropylene, or the like). Note that, in the secondary battery (e.g., a lithium polymer battery) using a solid electrolyte or a gelatinous electrolyte, the electrolyte itself can be configured to serve as the separator.

(S2) Battery-assembly Assembling Step

Herein, the electrode body and the electrolyte are accommodated in a battery outer case, and thus, a battery assembly is assembled. As the battery outer case, a battery outer case made of a lightweight metal material such as aluminum or steel can be preferably employed, for example. As the electrolyte, an electrolyte (nonaqueous electrolyte) containing a supporting salt in a nonaqueous solvent is preferably used. Alternatively, a solid electrolyte (typically, in a so-called gel shape) obtained by adding polymers to the above electrolyte may be used. The nonaqueous solvent is not limited in particular, and various organic solvents used in an electrolyte of a general secondary battery, such as organic solvents of carbonates, ethers, esters, nitriles, sulfones, lactones, and the like can be used. Especially, carbonates such as ethylene carbonate (EC), propylene carbonate (PC), diethyl carbonate (DEC), dimethyl carbonate (DMC), ethylmethyl carbonate (EMC), and the like can be preferably used. As the supporting salt, a supporting salt used for a general secondary battery can be used selectively as appropriate, provided that the supporting salt contains a charge carrier (e.g., lithium ion, sodium ion, magnesium ion, and the like; the lithium ion is used in a case of a lithium-ion secondary battery). For example, in a case where the charge carrier is the lithium ion, lithium salts such as $LiPF_6$, $LiBF_4$, and $LiClO_4$ can be preferably used. Further, it is preferable that a concentration of the supporting salt be adjusted to 0.7 mol/L to 1.3 mol/L relative to the whole electrolyte.

Note that the electrolyte used herein can contain a component other than the nonaqueous solvent and the supporting salt as necessary to such an extent that an effect of the present invention is not greatly impaired. Such an optional component can be used for one or more purposes such as improvement of preservability of the battery (restraint of a decrease in capacity during storage, and so on), improvement of the cycle characteristic, improvement of initial charge and discharge efficiency, improvement of input and output performance, and an increase in a gas generation amount at the time of overcharge. Examples of such an optional component include film-formers such as vinylene carbonate (VC), vinylethylene carbonate (VEC), and lithium bis(oxalato)borate (LiBOB); gas generants such as cyclohexylbenzene (CHB) and biphenyl (BP), and the like.

The present invention is more specifically described by taking, as an example, a secondary battery (a single cell) configured such that an electrode body (a wound electrode body) flatly wound and an electrolyte are accommodated in a container (a battery outer case) having a flat rectangular solid shape (box shape), as a schematic configuration of the secondary battery according to one embodiment of the present invention. However, this is not intended to limit the present invention to the following description. In the following drawings, the same reference sign is assigned to members/parts that yield the same effect, and a redundant description is omitted or simplified. A dimensional relationship (length, width, thickness, and the like) in each drawing does not necessarily show an actual dimensional relationship.

Figure 5:
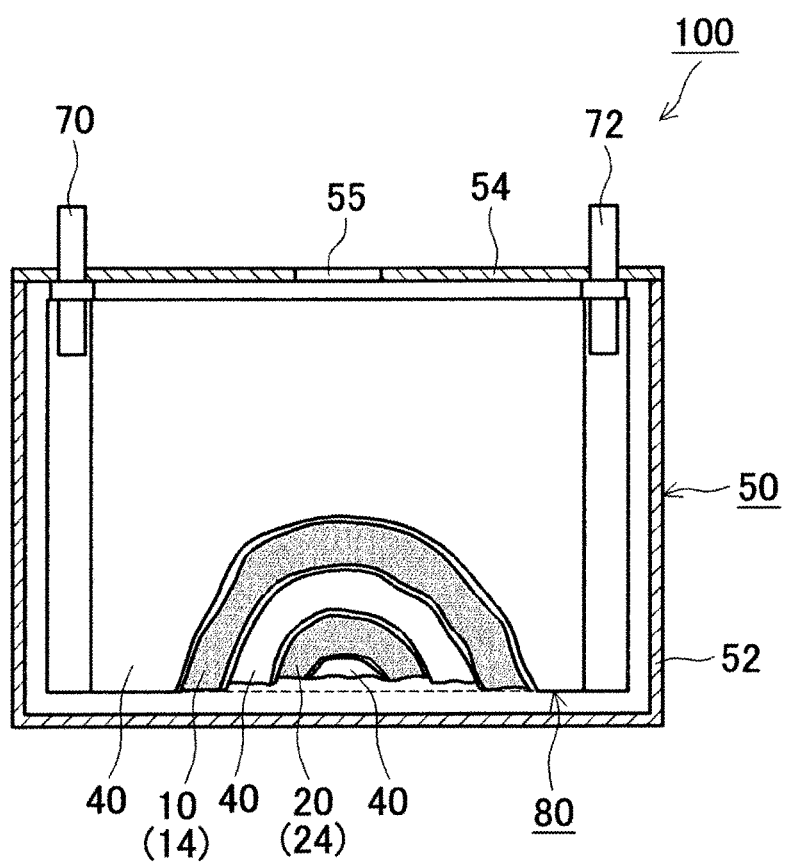
FIG. 5 is a sectional view schematically illustrating a configuration of the secondary battery according to one embodiment.

FIG. 5 is a drawing of a longitudinal section schematically illustrating a sectional structure of a secondary battery 100. As illustrated in FIG. 5, the secondary battery 100 is configured such that an electrode body (a wound electrode body) 80 and a nonaqueous electrolyte (not shown) are accommodated in a battery outer case 50 having a flat box shape. The electrode body 80 is configured such that an elongated positive electrode sheet 10 and an elongated negative electrode sheet 20 are wound via elongated separators 40 in a flat shape.

The battery outer case 50 includes a battery-outer-case main body 52 of which an upper end is opened, and a cover 54 covering an opening of the battery-outer-case main body 52. The battery-outer-case main body 52 is flat and has a rectangular solid shape (box shape). An external-connection positive terminal 70 electrically connected to a positive electrode of the wound electrode body 80, and a negative terminal 72 electrically connected to a negative electrode of the wound electrode body 80 are provided on a top face (that is, the cover 54) of the battery outer case 50. Further, the cover 54 is provided with a relief valve 55 configured to exhaust gas generated inside the battery outer case 50 to outside the case 50, similarly to a battery outer case of a conventional secondary battery.

Figure 6:
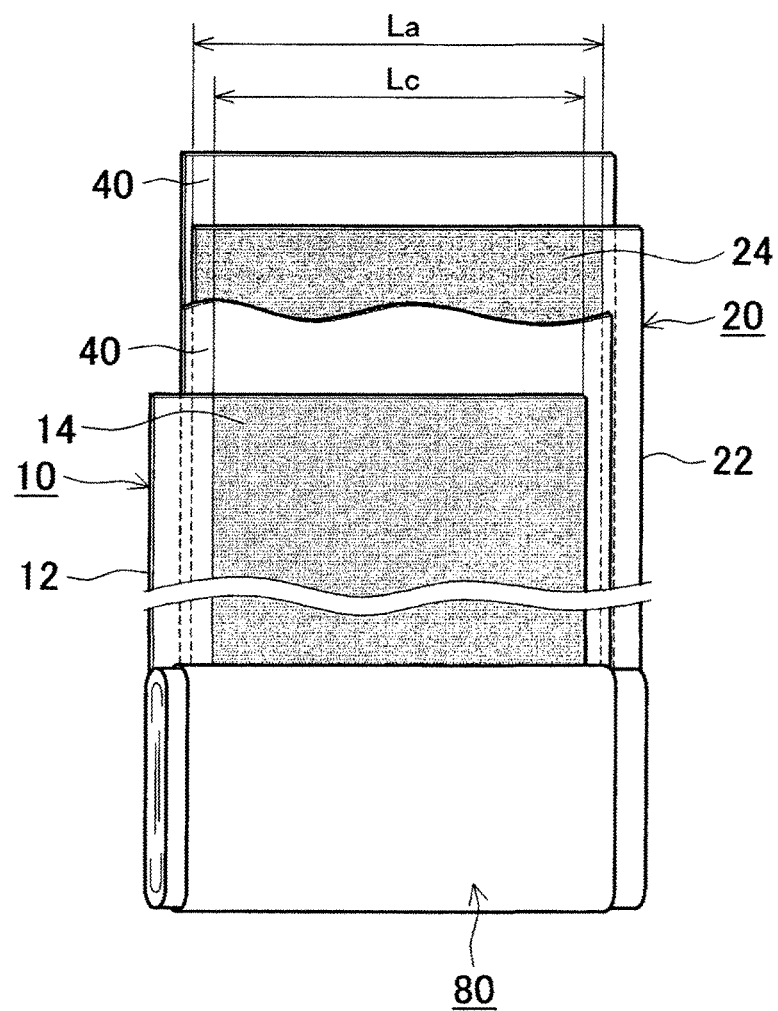
FIG. 6 is a sectional view schematically illustrating a configuration of a wound electrode body according to one embodiment.

FIG. 6 is a schematic view illustrating a configuration of the wound electrode body 80 illustrated in FIG. 5. As illustrated in FIG. 6, the wound electrode body 80 according to the present embodiment includes an elongated sheet-shaped positive electrode (positive electrode sheet) 10, and an elongated sheet-shaped negative electrode (negative electrode sheet) 20 at a stage prior to assembling. The positive electrode sheet 10 includes an elongated positive current collector 12, and a positive-electrode active material layer 14 formed on at least one surface (typically, both surfaces) thereof along a longitudinal direction. The negative electrode sheet 20 includes an elongated negative current collector 22, and a negative-electrode active material layer 24 formed on at least one surface (typically, both surfaces) thereof along a longitudinal direction. Further, an insulating layer for preventing direct contact between the positive-electrode active material layer 14 and the negative-electrode active material layer 24 is placed therebetween. Herein, two elongated sheet-shaped separators 40 are used as the insulating layer. Such a wound electrode body 80 can be manufactured, for example, in such a manner that a laminated body obtained by laminating the positive electrode sheet 10, the separator sheet 40, the negative electrode sheet 20, and the separator sheet 40 in this order is wound in the longitudinal direction, and an obtained wound boy is shaped in a flat shape by being pressed from its side surface direction so as to be flattened.

A winding core portion is formed in a central portion of the wound electrode body 80 in a width direction defined as a direction directed from one end part of the wound electrode body 80 in a winding-shaft direction toward the other end part thereof. The winding core portion is a portion where the positive-electrode active material layer 14 formed on the surface of the positive current collector 12 and the negative-electrode active material layer 24 formed on the surface of the negative current collector 22 are laminated so as to overlap with each other thickly. Further, at both ends of the wound electrode body 80 in the winding-shaft direction, a positive-electrode active material layer non-forming part of the positive electrode sheet 10 and a negative-electrode active material layer non-forming part of the negative electrode sheet 20 protrude outwardly from the winding core portion. The positive current collector is attached to a positive-electrode-side protruding part, and the negative current collector is attached to a negative-electrode-side protruding part, so that they are electrically connected to the positive terminal 70 (FIG. 5) and the negative terminal 72 (FIG. 5), respectively.

In the invention described herein, a width La of the negative-electrode active material layer 24 is formed wider than a width Lc of the positive-electrode active material layer 14. Because of this, when the positive electrode sheet 10 and the negative electrode sheet 20 are placed so as to overlap with each other, the negative-electrode active material layer 24 has a part opposed to the positive-electrode active material layer 14, and a non-facing portion not opposed to the positive-electrode active material layer 14. Charge carriers are stored in such a non-facing portion, thereby making it possible to effectively restrain metal deposition on the negative electrode. However, if the non-facing portion is too large, an irreversible capacity increases, which may decrease a cycle characteristic and a storage characteristic. In view of this, it is preferable that a difference between La and Lc be 20 mm or less (e.g., 10 mm or less), and it is particularly preferable that right and left ends of La protrude from Lc by approximately 1 mm to 5 mm (e.g., 1 mm to 3 mm). In other words, it is preferable that a phase difference between the positive-electrode active material layer 14 and the negative-electrode active material layer 24 be 1 mm to 5 mm (e.g., 1 mm to 3 mm).

The secondary battery (typically, a lithium-ion secondary battery) described herein is usable for various purposes, and has such features that the secondary battery has high battery performance (e.g., a high energy density) and has an excellent reliability. For example, the secondary battery has a high initial capacity, and can exhibit excellent input and output densities even in a low SOC region. Accordingly, by making use of such properties, the second battery described herein can be preferably used as a power source (a driving power supply) for a motor provided in a vehicle, for example. The type of the vehicle is not limited in particular. Typical examples of the vehicle include an automobile, more specifically, a plug-in hybrid vehicle (PHV), a hybrid vehicle (HV), an electric vehicle (EV), and the like, for example. Accordingly, as another aspect of the present invention, a vehicle including any of the secondary batteries described herein (which can be in a form of a battery pack) can be provided.

The following describes some examples related to the present invention, but it is not intended to limit the present invention to the following concrete examples.

A $Li_{1.00}Ni_{0.38}Co_{0.32}Mn_{0.30}O_2$ powder as a positive-electrode active material powder, acetylene black (AB) and graphite (made by TIMCAL Ltd., product name "KS4") as conductive materials, and polyvinylidene fluoride (PVdF) as a binder were mixed with N-methylpyrrolidone (NMP) so that a mass ratio thereof was 91:3:3:3. Thus, a slurry composition was prepared. The composition was applied to an elongated aluminum foil (a positive current collector) having a thickness of approximately 15 μm. Thus, a positive-electrode active material layer was formed. A positive electrode thus obtained was dried and pressed, so as to manufacture a sheet-shaped positive electrode (a positive electrode sheet). Then, an amorphous coated graphite powder as a negative-electrode active material, styrene butadiene rubber (SBR), and carboxymethyl cellulose (CMC) were mixed with ion-exchange water so that a mass ratio thereof was 98.3:1.0:0.7. Thus, a slurry composition was prepared. The composition was applied to an elongated copper foil (a negative current collector) having a thickness of approximately 10 μm. Thus, a negative-electrode active material layer was formed. A negative electrode thus obtained was dried and pressed, so as to manufacture a sheet-shaped negative electrode (a negative electrode sheet).

Subsequently, the positive electrode sheet and the negative electrode sheet manufactured as such were laminated via two separators. The separators used herein have a three-layer structure in which a polypropylene (PP) layer was laminated on either side of a polyethylene (PE) layer. A laminated body thus obtained is wound, and a wound electrode body thus obtained is pressed from a side surface direction so that the wound electrode body is flattened. Hereby, the wound electrode body was shaped in a flat shape. Then, a positive terminal was joined by welding to an end part of the positive current collector of the wound electrode body, and a negative terminal was joined by welding to an end part of the negative current collector of the wound electrode body. The electrode body was accommodated in a battery outer case, and a nonaqueous electrolyte was poured therein. Note that the nonaqueous electrolyte used herein was prepared as follows: a mixed solvent containing ethylene carbonate (EC), ethylmethyl carbonate (EMC), and dimethyl carbonate (DMC) was prepared so that a volume ratio thereof was 3:4:3; $LiPF_6$ as an electrolyte was dissolved in the mixed solvent so that a concentration thereof was about 1 mol/L; and further, vinylene carbonate was added thereto in a ratio of 0.75 mass % relative to the whole nonaqueous electrolyte, cyclohexylbenzene was added thereto in a ratio of 4 mass %, and biphenyl was added thereto in a ratio of 1 mass %. Then, a cover was attached to an opening of the battery outer case, and joined thereto by welding. Thus, a battery assembly (a capacity ratio ($C_N/C_P$) was 1.36, a rated capacity was 28 Ah) was assembled.

Then, the battery assembly thus assembled was sandwiched by a jig, and then pressed and restrained so that a restraining pressure was 400 kgf. Subsequently, the battery assembly thus restrained was subjected to constant-current charge at a constant current of 20 A until a voltage between the positive and negative terminals reached 3.95 V, and further subjected to constant-voltage charge at 3.95 V until a current reached 0.1 A (a charging step). Subsequently, the battery assembly thus subjected to the initial charge was placed in a temperature-control constant-temperature bath, so that its temperature was increased to 60° C., and then, aging was performed under a temperature environment of 60° C. until an elapsed time from start of the temperature increase reached 20 hours (an aging step). Subsequently, the battery assembly was subjected to constant-current discharge at a constant current of 60 A until the voltage between the positive and negative terminals reaches 2.0 V. Here, a zone capacity and an IV resistance were measured. Then, the battery assembly was subjected to constant-current discharge at a constant current of 20 A until the voltage between the positive and negative terminals reaches 2.0 V, and further subjected to constant-voltage discharge at 2.0 V until the current reached 0.5 A, so that a voltage difference accumulation value Vs from the measurement of the zone capacity reached a value in Table 1 (a pre-inspection discharge step). Here, the voltage difference accumulation value Vs was calculated by accumulating a difference between 3.5 V and an output voltage over a duration (s) of the pre-inspection discharge step from the measurement of the zone capacity. Subsequently, a setting voltage Vp was calculated from an apparent resistance value R and a start voltage Vb shown in Table 1. Here, the apparent resistance value R was calculated based on a cutoff current value (0.5 A) and the voltage difference accumulation value Vs in the pre-inspection discharge step. Then, the battery assembly was subjected to constant-current discharge until its voltage reached the setting voltage Vp shown in Table 1, and further subjected to constant-voltage discharge at the setting voltage Vp until the current reached 0.5 A. Thus, the voltage was adjusted (a voltage adjustment step). Subsequently, the battery assembly was left for stand under an environment of 20° C. for 5 days, so as to be self-discharged. Then, a voltage drop amount was calculated by subtracting a voltage value after the self-discharge from a voltage value before the self-discharge (a self-discharge inspection step), so as to check whether or not minute short-circuit occurred in the battery (a deficiency determination step).

TABLE 1

| | voltage difference accumulation value Vs (V · s) | duration (minute) from pre-inspection discharge to voltage adjustment | start voltage Vb (V)* | setting voltage Vp (V) |
| --- | --- | --- | --- | --- |
| Example 1 | 7457.20 | 68.71 | 3.28 | 3.300 |
| Example 2 | 6703.19 | 61.35 | 3.282 | 3.298 |
| Example 3 | 6241.96 | 56.85 | 3.284 | 3.298 |
| Example 4 | 5797.85 | 52.52 | 3.286 | 3.299 |
| Example 5 | 5369.93 | 48.34 | 3.288 | 3.300 |
| Example 6 | 4957.32 | 44.31 | 3.29 | 3.302 |
| Example 7 | 4390.82 | 38.78 | 3.292 | 3.303 |
| Example 8 | 4070.67 | 35.66 | 3.294 | 3.305 |
| Example 9 | 3750.51 | 32.54 | 3.296 | 3.307 |
| Example 10 | 3590.43 | 30.97 | 3.297 | 3.309 |

*Assume start voltage Vb = inspection voltage Vm (increase voltage 0).

It was found that, in the battery having a configuration as described in the above example, if each of the conditions, i.e., the CV time (a duration from the pre-inspection discharge to the voltage adjustment), the start voltage Vb, and the setting voltage Vp as shown in Examples 1 to 10 in Table 1 are satisfied, a voltage increased amount can be reduced, thereby making it possible to perform the inspection on the secondary battery in a shorter time in comparison with a conventional technique. Such a result indicates a technical significance of the present invention. Note that, in a battery having another configuration in which operation potential ranges of a positive electrode and a negative electrode are different from the above, its voltage difference accumulation value can be generally equal to the value in Table 1, but preferred ranges of its start voltage Vb and its setting voltage Vp can be different therefrom.

The specific example of the present invention has been explained in detail. However, the example is for illustration only, and does not limit the scope of the claims. The technique described in the scope of the claims includes the foregoing example with various modifications and changes.

The invention claimed is:

1. An inspection method for a secondary battery, the inspection method comprising:
    charging the secondary battery;
    performing an aging process;
    calculating a voltage difference accumulation value by integrating a difference between a predetermined voltage and a voltage of the secondary battery that changes over time, for a predetermined period from start of discharge to end of the discharge;
    determining a discharge condition that allows the voltage difference accumulation value to be placed in a predetermined range;
    performing pre-inspection discharge based on the discharge condition;
    performing voltage adjustment;
    performing self-discharge inspection; and
    determining whether or not internal short-circuit occurs in the secondary battery based on a result of the self-discharge inspection.

2. The inspection method according to claim 1, further comprising:
    the predetermined range is determined based on the following formula:

$$Va = -0.589881 Ln(Vs) + 5.011706$$

where Va indicates a maximum fluctuation ratio of a voltage at a beginning of the self-discharge inspection, and Vs indicates the voltage difference accumulation value.

3. The inspection method according to claim 1, wherein the discharge condition satisfies that the voltage difference accumulation value is between 2,980 and 34,000 inclusive.

4. The inspection method according to claim 1, further comprising:
determining a setting voltage based on the voltage difference accumulation value, the setting voltage being a voltage that is set at a time when the voltage adjustment is performed.

5. The inspection method according to claim 1, further comprising:
determining a setting voltage that is set at a time when the voltage adjustment is performed, based on the following formula:

$$Vp = I \times R + Vb$$

where Vp indicates the setting voltage, I indicates a cutoff current of constant-voltage discharge, a unit of I being ampere, R indicates an apparent resistance value calculated based on the voltage difference accumulation value, a unit of R being ohm, wherein:
the voltage adjustment includes charging the secondary battery to the setting voltage by constant-current charge, and then charging the secondary battery at the setting voltage by constant-voltage charge.

6. The inspection method according to claim 1, wherein the pre-inspection discharge includes performing constant-voltage discharge after constant-current discharge.

7. The inspection method according to claim 1, wherein a discharge final voltage in the pre-inspection discharge is between 1.8 V and 2.3 V inclusive.

8. A method for manufacturing a secondary battery, the method comprising:
preparing an electrode body including a positive electrode having a positive-electrode active material layer and a negative electrode having a negative-electrode active material layer, a surface area of the negative-electrode active material layer being larger than a surface area of the positive-electrode active material layer, and the negative-electrode active material layer including a part faced to the positive-electrode active material layer and a part not faced to the positive-electrode active material layer;
assembling a battery assembly by use of the electrode body and an electrolyte; and
inspecting whether or not internal short-circuit occurs in the secondary battery by an inspection method, so as to select a non-defective product,
the inspection method including:
charging the secondary battery;
performing an aging process;
calculating a voltage difference accumulation value by integrating a difference between a predetermined voltage and a voltage of the secondary battery that changes over time, for a predetermined period from start of discharge to end of the discharge;
determining the discharge condition that allows the voltage difference accumulation value to be placed in a predetermined range;
performing pre-inspection discharge based on the discharge condition;
performing voltage adjustment;
performing self-discharge inspection; and
determining whether or not internal short-circuit occurs in the secondary battery based on a result of the self-discharge inspection.

* * * * *